(12) United States Patent
Ito

(10) Patent No.: US 7,047,903 B2
(45) Date of Patent: May 23, 2006

(54) METHOD AND DEVICE FOR PLASMA CVD

(75) Inventor: Norikazu Ito, Yokohama (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 142 days.

(21) Appl. No.: 10/466,853

(22) PCT Filed: Jan. 21, 2002

(86) PCT No.: PCT/JP02/00381

§ 371 (c)(1),
(2), (4) Date: Jul. 22, 2003

(87) PCT Pub. No.: WO02/058121

PCT Pub. Date: Jul. 25, 2002

(65) Prior Publication Data

US 2004/0053479 A1 Mar. 18, 2004

(30) Foreign Application Priority Data

Jan. 22, 2001 (JP) ............................. 2001-012702

(51) Int. Cl.
*H01L 21/306* (2006.01)
*C23C 16/00* (2006.01)
(52) U.S. Cl. ................... 118/723 I; 156/345.48
(58) Field of Classification Search ............ 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 5,324,360 A * | 6/1994 | Kozuka | ..................... 118/719 |
| 5,525,159 A | 6/1996 | Hama et al. | |
| 5,571,366 A | 11/1996 | Ishii et al. | |
| 5,795,452 A | 8/1998 | Kinoshita et al. | |
| 5,824,158 A | 10/1998 | Takeuchi et al. | |
| 5,891,349 A | 4/1999 | Tobe et al. | |
| 6,030,667 A | 2/2000 | Nakagawa et al. | |
| 6,068,784 A | 5/2000 | Collins et al. | |
| 6,181,069 B1 | 1/2001 | Tonotani et al. | |
| 6,503,816 B1 | 1/2003 | Ito et al. | |

(Continued)

FOREIGN PATENT DOCUMENTS

DE  41 36 297 A1  5/1993

(Continued)

OTHER PUBLICATIONS

Kroll et al., Fast Deposition of a-Si:H Layers and solar Cells in a Large-Area (40×40cm$^2$) VHF-GD Reactor,Materials Research Society Symposium Proceedings vol. 557, 1999, pp. 120-126, Materials Research Society , Warrendale, PA.

(Continued)

*Primary Examiner*—Luz Alejandro-Mulero
(74) *Attorney, Agent, or Firm*—Buchanan Ingersoll PC

(57) ABSTRACT

A plasma CVD apparatus is used to form thin films of excellent uniform thickness on both surfaces of a substrate without the step of turning a substrate over, and includes two connected vacuum chambers, each of which is equipped with a plurality of electrode array layers therein, whereby at least a pair of substrate holders are transported between adjacent electrode array layers in a first vacuum chamber to form a first thin film on the one surface of substrates facing the electrode array layers, and then transported into a second vacuum chamber so that the other surface of the substrates faces to an electrode array layer to form a second thin film on the other surface.

3 Claims, 6 Drawing Sheets

U.S. PATENT DOCUMENTS

| | | |
|---|---|---|
| 6,719,876 B1 * | 4/2004 | Ueda et al. ............ 156/345.48 |
| 2004/0020432 A1 * | 2/2004 | Takagi et al. ............ 118/723 I |

FOREIGN PATENT DOCUMENTS

| | | |
|---|---|---|
| DE | 195 03 205 C1 | 7/1996 |
| EP | 0 908 921 A1 | 4/1999 |
| JP | 63-276222 | 11/1988 |
| JP | 3-13578 | 1/1991 |
| JP | 3-122274 | 5/1991 |
| JP | 04-021781 | 1/1992 |
| JP | 04-236781 | 8/1992 |
| JP | 07-094421 | 4/1995 |
| JP | 9-106952 | 4/1997 |
| JP | 09-268370 | 10/1997 |
| JP | 10-060654 | 3/1998 |
| JP | 10-265212 | 10/1998 |
| JP | 11-131244 | 5/1999 |
| JP | 11-243062 | 9/1999 |
| JP | 11-260593 | 9/1999 |
| JP | 11-317299 | 11/1999 |
| JP | 2000-12471 | 1/2000 |
| JP | 2000-345351 | 12/2000 |
| JP | 2001-035697 | 2/2001 |
| WO | 99/19898 A2 | 4/1999 |

OTHER PUBLICATIONS

Ryuichi Miyano et al. "New Plasma Source of Coaxially Symmetric Surface Wave in VHF Band", Journal of Research Institute for Science and Technology, vol. 8, (1996), pp. 65-69.

Yaoxi Wu et al.. "The Influence of Antenna Configuration and Standing Wave Effects on Density Profile in a Large-Area Inductive Plasma Source", Plasma Sources Science Technology 9 (2000), pp. 210-218.

E. Räuchle "Duo-Plasmaline, A Surface Wave Sustained Linearly Extended Discharge", Journal of Physics IV France 8 (1998). Pr7-99-Pr7-108.

"Waves in the Fluid Plasma"; Principles of Plasma Physics, pp. 146-153.

Z. Zakrzewski et al. "Linear Field Applicators", Journal of Physics IV France 8 (1998), Pr7-109-Pr7-118.

* cited by examiner (a)

(b)

(c)

(a)    (b)

(a)

(b)

METHOD AND DEVICE FOR PLASMA CVD

This application is a 371 of PCT/JP02/00381 filed on Jan. 21, 2002.

TECHNICAL FIELD

The present invention relates to a Plasma CVD method and a Plasma CVD apparatus and, more particularly, to the Plasma CVD method and apparatus for forming thin films of excellent uniform thickness on both surfaces of a substrate.

BACKGROUND OF INVENTION

A solar cell generally consists of a p-n junction or p-i-n junction with silicon (Si) or compound semiconductors formed on a substrate to convert sunlight incident onto its front surface into electricity. In order to increase the electric power generation, a solar cell utilizing sunlight incident on the back surface as well as front surface is proposed. Such a solar cell has, for example, a configuration shown in FIG. 7, and is fabricated by depositing a p-type amorphous Si (p-type a-Si) film 102 and an n-type amorphous Si (n-type a-Si) film 103 on the respective surfaces of i-type crystal silicon 101 using a plasma CVD method, and then by forming a transparent electrode 104 using a sputtering method and current collective electrodes 105 using a screen printing method on both surfaces.

For example, a parallel-plate type plasma CVD apparatus shown in FIG. 8(b) has been mainly used for the deposition of the a-Si film. This apparatus is composed of a load lock chamber 110, a heating chamber 120, a plasma CVD (PCVD) chamber 130 to deposit the a-Si film, and a cooling chamber 140. The adjacent chambers are connected through a gate valve 106. The i-type silicon substrates 101 are mounted on a substrate holder 107, which acts as a backing plate, as shown in FIG. 8(a) and is transported in the direction of the arrow of FIG. 8(b). That is, after substrates are mounted on the substrate holder as shown in FIG. 8(a), the substrate holder is transported to the load lock chamber 110, and the chamber is thereafter evacuated. Then, the gate valve is opened to transport the substrate holder to heating chamber 120. After the substrates are heated to a predetermined temperature using a heater 121, the substrate holder is transported to parallel-plate type PCVD chamber 130. When the substrate holder is transported into PCVD chamber 130, a film forming gas ($SiH_4/PH_3$ gas) is introduced into the PCVD chamber 130 and high-frequency power is fed to a powered electrode 131 to generate plasma and form the n-type a-Si film on silicon substrate 101. Then, the substrate holder is transported to cooling chamber 140.

After the substrate temperature drops, the venting gas is introduced into the cooling chamber 140 to the atmospheric pressure. The substrate holder 107 is taken out and the substrates are turned over in order to form the p-type a-Si film on the other surface of substrate. The substrate holder is sent into the load lock chamber of the plasma CVD apparatus shown in FIG. 8(b) and the p-type a-Si film is deposited in the same manner as mentioned above. Thus, the p-i-n junction is formed. Here, $SiH_4/B_2H_6$ gas is introduced into the PCVD chamber as film forming gas.

Then, a transparent conductive film such as ITO is formed on both surfaces of the silicon substrate 101 in the sputtering apparatus. Finally, current collecting electrodes are formed using, for example, the screen printing method to complete the solar cell.

DISCLOSURE OF INVENTION

As mentioned above, the parallel-plate type plasma CVD apparatus has been mainly used for the deposition of a-Si film. However, when the thin film is formed on a substrate with high electric resistance or an insulator with the parallel-plate type PCVD apparatus, high frequency current will hardly flow through the substrate unless the backing plate is placed behind the substrate and the plasma density on the front surface of substrate remarkably decreases. Consequently, the film thickness in the central part of substrate is different from that in the circumference part, meaning that the thin film of excellent uniform thickness is hard to be obtained. This tendency becomes more remarkable as the substrate becomes larger. Therefore, the backing plate which acts as the channel of high-frequency current is indispensable in order to form thin films of excellent uniform thickness. For this reason, the productivity remarkably deteriorates when the thin film is formed on both surfaces of substrate. That is, the substrate holder must be taken out of the apparatus to turn the substrate over after the thin film is formed on the one surface, Therefore, the evacuating process of the load lock chamber, the venting process of the cooling chamber, and the heating/cooling process of substrate must be made twice.

Thus, if higher throughput is requested, two sets of apparatuses shown in FIG. 8(b) must be installed, which invites the enlargement of the whole manufacturing apparatus and its cost increase.

Under such circumstances, the object of present invention is to provide a plasma CVD method and a plasma CVD apparatus, which makes it possible to form thin films of excellent uniform thickness on both surfaces of a substrate without the step of turning the substrate over.

SUMMARY OF THE INVENTION

The first feature of this invention is a plasma CVD method and plasma CVD apparatus, comprising; a vacuum chamber equipped with a gas supply port and an exhaust port; at least two inductively coupled electrodes with a power feeding portion and a grounded portion arranged in the vacuum chamber, and a substrate holder arranged between the two inductively coupled electrodes, which holds a substrate at a circumference portion so that both surfaces of the substrate are exposed, whereby a film forming gas is introduced from the gas supply system and high-frequency power is fed to the power feeding portion to generate plasma along the inductively coupled electrode to form simultaneously or separately a thin film on both surfaces of the substrate.

In addition, different thin films can be formed on respective surfaces of substrate by providing the vacuum chamber with a second gas supply port and switching simultaneously the introduction of two different gases and the supply of high-frequency power to two inductively coupled electrodes. Furthermore, it is also possible to simultaneously form different thin films on respective substrate surfaces by arranging a partition plate to divide the chamber into two film forming spaces together with the substrate holder and by providing one exhaust port in each film forming space or controlling the gas flow so that different gases will flow in the respective film forming spaces without mixing.

It is also possible to realize the plasma CVD apparatus with a high productivity by arranging at least three electrode array layers, each of which has a plurality of inductively coupled electrodes forming one plane, and arranging the substrate holder between two electrode array layers.

The second feature of this invention is a plasma CVD method and a plasma CVD apparatus, comprising: two connected vacuum chambers, each equipped with a gas supply port and an exhaust port, and an inductively coupled electrode with a power feeding portion and a grounded portion arranged in each vacuum chamber, whereby a substrate holder holding a substrate at a circumference portion so that both surfaces of substrate are exposed is transported to the first vacuum chamber of the two vacuum chambers, a first film forming gas is introduced through the gas supply port and high-frequency power is fed to the power feeding portion of the inductively coupled electrode to generate plasma and to form a first thin film on the one substrate surface facing the inductively coupled electrode, thereafter the substrate holder is transported to the second vacuum chamber so that the other surface of substrate on which the first thin film is not formed faces to the inductively coupled electrode, a second film forming gas is introduced through the gas supply port and high-frequency power is fed to the power feeding portion of inductively coupled electrode to generate plasma and to form a second thin film on the substrate surface on which the first thin film is not formed.

Moreover, in order to construct a high productivity apparatus, electrode arrays, each of which is composed of a plurality of inductively coupled electrodes arranged in parallel to each other forming one plane, are arranged in N layers in the first vacuum chamber (or in the second chamber) and (N−1) layers in the second vacuum chamber (or in the first chamber), and two substrate holders are arranged between two electrode array layers. Here, N is a natural number of 2 or larger.

Figure 1:
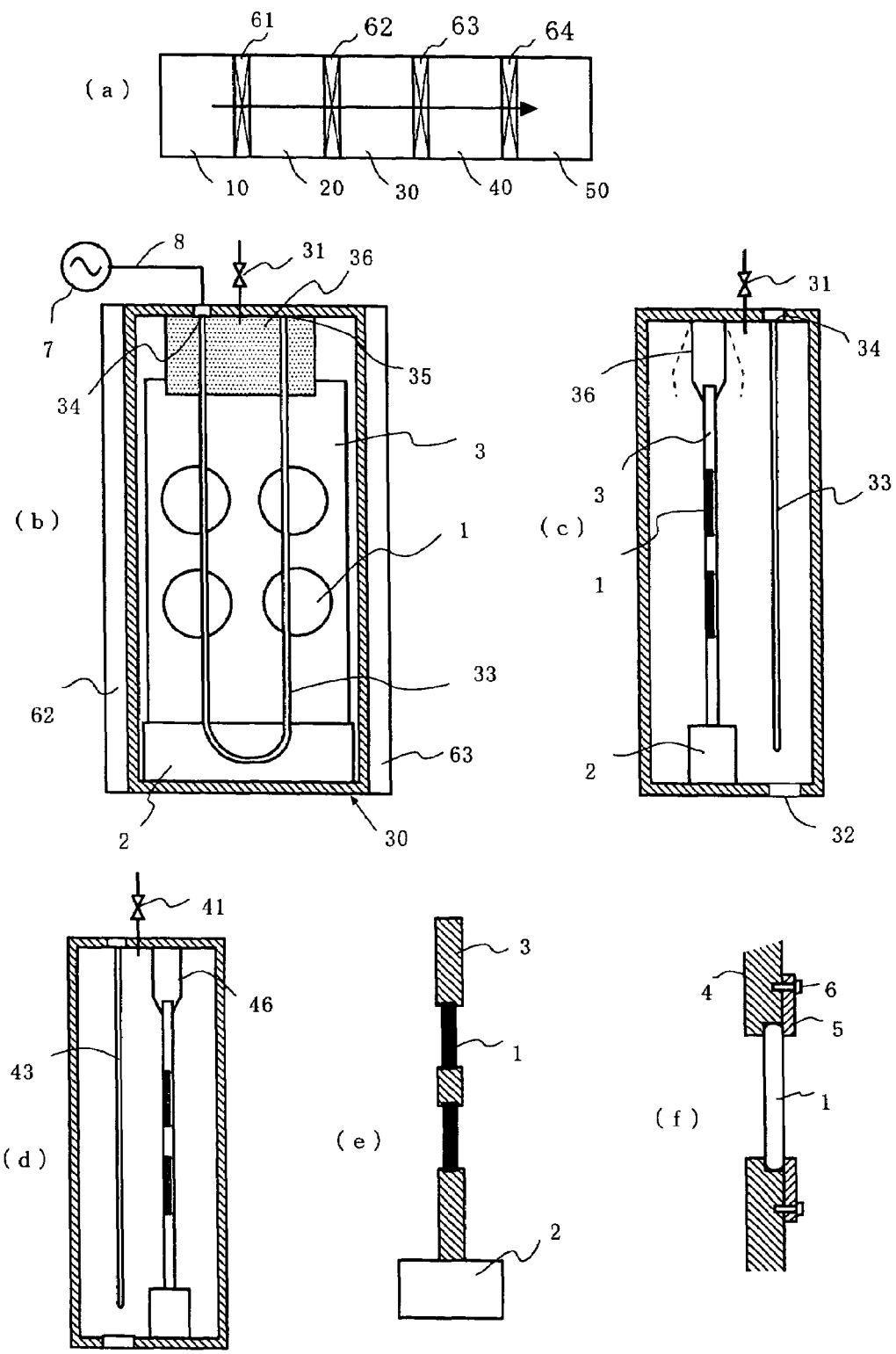
FIGS. 1a–1f is a schematic view showing the first embodiment of plasma CVD apparatus of this invention.

In the drawings, a numeral 1 denotes substrate, 2; carrier, 3; substrate holder, 7; high-frequency power source, 8; coaxial cable, 10 and 110; load lock chamber, 20 and 120; heating chamber, 30, 40, 70, and 130; plasma CVD chamber, 31 and 41; gas supply pipe line, 32; exhaust port, 33 and 43; inductively coupled electrode, 34; power feeding portion, 35; grounded portion, 36; substrate holder fixing jig, 50 and 140; cooling chamber, 61-64 and 106; gate valve, 101; i-type crystal silicon, 102; p-type a-Si, 103; n-type a-Si, 104; transparent electrode, and 105; current collecting electrode.

PREFERRED EMBODIMENTS OF INVENTION

The embodiments of this invention will be explained in detail below with reference to the drawings.

First Embodiment

Figure 7:
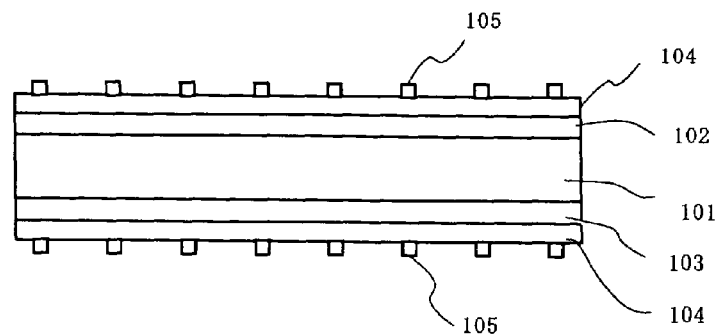
FIG. 7 is a schematic view showing a configuration of solar cell.
Figure 8:
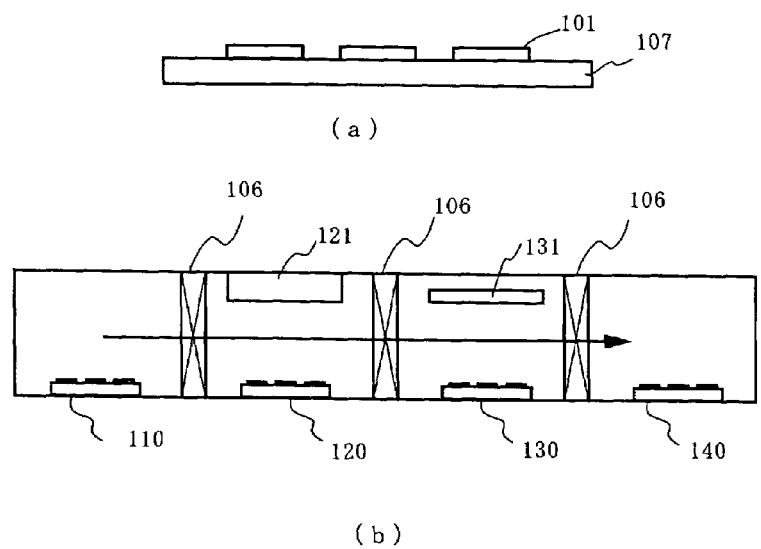
FIGS. 8a–8b is a schematic view of a conventional plasma CVD apparatus.

The first embodiment of this invention is shown in FIG. 1. FIG. 1 is a schematic view showing an example of the plasma CVD apparatus used for manufacturing solar cells shown in FIG. 7.

As is shown in FIG. 1(a), a plasma CVD apparatus is composed of a load lock chamber 10, a heating chamber 20, a first plasma CVD (PCVD) chamber 30, a second PCVD chamber 40, and a cooling chamber 50. These chambers are connected through gate valves 61–64. The substrates 1 are held by a substrate holder 3 so that both thin film formation surfaces of substrate are exposed, for example, by pressing the circumference portion of substrate with a plate 4 having apertures and press plates 5, and fixing them with screws 6, as shown in FIG. 1(f)

The substrate holder 3 holding a plurality of substrates is fixed on a carrier 2 (FIG. 1(e)), and transported along the rails constructed in the chambers in the direction of arrow shown in FIG. 1(a) to process the substrates in respective chambers. That is, the substrate holder is transported from load lock chamber 10 to heating chamber 20 where the substrates are heated to a predetermined temperature from both sides of substrate holder 3 using heaters such as infrared lamps. Then, the substrate holder is transported to first PCVD chamber 30 and then second PCVD chamber 40 to form the n-type a-Si film and the p-type a-Si film on the respective surfaces of substrate. After thin films are formed, the substrate holder is sent to cooling chamber 50 to be cooled to a predetermined temperature. The substrate holder is then taken out of the chamber and is sent to the apparatuses to form the transparent conductive film such an ITO film and current collective electrodes. Here, a sputtering chamber may be connected to the PCVD chamber instead of the cooling chamber to form the transparent conductive film immediately after the a-Si film is formed.

The configuration of first PCVD chamber 30 is explained using FIGS. 1(b) and 1(c).

FIGS. 1(b) and 1(c) are schematic views of the inside of the chamber seen from the front and seen towards the transportation direction, respectively. A gas supply pipe line 31 for a film forming gas (for example, $SiH_4/PH_3$ gas) and an exhaust port 32 are provided in the PCVD chamber, and inductively coupled electrode 33 which is folded back at the center is arranged in the chamber. The one end of inductively coupled electrode 33, i.e. power feeding portion 34, is connected to a high-frequency power source 7 through a coaxial cable 8, and the other end, i.e. grounded portion 35, is connected to chamber wall to be earthed.

When carrier 2 conveying the substrate holder 3 is transported to PCVD chamber 30, a substrate holder fixing jig 36 begins to move from the position shown by the broken line to the position shown by the solid line to fix the substrate holder by contacting both surfaces of substrate holder. In this state, $SiH_4/PH_3$ gas is introduced into the chamber through gas supply pipe line 31 and the pressure is set at a predetermined value. Then, high-frequency power is fed to inductively coupled electrode 33. The plasma generates along electrode 33 and the n-type a-Si film deposits on the substrate surface facing electrode 33. Although the gas also flows over the other surface as well as the film formation surface of the substrate, the thin film will not deposit on the other surface of the substrate which does not face the electrode since the plasma is prevented by the substrate holder and the substrate holder fixing jig from coming into the other surface of substrate.

When the film thickness reaches a predetermined value, the supply of high-frequency power and the film forming gas are cut off and then the chamber is evacuated. The gate valve 63 is opened to transport the substrate holder to second PCVD chamber 40. FIG. 1(d) is a schematic view showing the inside of the second PCVD chamber as seen toward the transportation direction. The configuration is almost the same as that of first PCVD chamber, except that the inductively coupled electrode 43 is arranged in the opposite side to the substrate holder. When the substrate holder is transported to second PCVD chamber 40, the substrate holder fixing jig 46 begins to close and fix the substrate holder. Then, $SiH_4/B_2H_6$ gas is introduced into the chamber through a gas supply pipe line 41 and high-frequency power is fed to inductively coupled electrode 43 to form the p-type a-Si film on the other surface of the substrate on which the n-type a-Si film is not formed. Thus, the p-type a-Si film and the n-type a-Si film deposits on the respective surfaces of i-type crystal silicon substrate to form the p-i-n junction.

As mentioned above, the film formation of p-type a-Si film and n-type a-Si film on respective surfaces of substrate can be continuously carried out by transporting carrier 2 with substrate holder 3 to respective chambers successively.

As mentioned above, in order to form the thin film of excellent uniform thickness, the backing plate must be placed behind the substrate in the conventional parallel-plate type PCVD apparatus. As a result, there is requested the step to turn substrates over. In addition, the heating/cooling process must be made twice. On the other hand, in this invention, the step of turning substrates over is not requested and the heating/cooling process is made only once, which makes it possible to reduce the number of processing chambers and improve the throughput. Moreover, two sets of a load lock chamber, a heating chamber, a PCVD chamber and cooling chamber are required to perform high throughput manufacturing in the case of conventional manufacturing apparatus. However, in the manufacturing apparatus of the embodiment shown in FIG. 1, although two chambers are necessary for PCVD process, only one chamber is necessary for other processes. This enables us to remarkably reduce the installation floor space and the apparatus cost.

The U-shaped inductively coupled electrode is exemplified in FIG. 1. The rectangularly folded shape can also be employed as well as U-shape as an electrode folded back at the center. Here, the distance from feeding portion 34 and grounded portion 35 to the turning portion is preferred to be nearly N/2 times (N: a natural number) of an excitation wavelength of the high-frequency power to stably generate and maintain the discharge. Here, the turning portion is exemplified by semicircular portions having a curvature in the case of the U-shape and by shorter straight portion between the two longer straight portions in the case of the rectangularly folded shape. These electrodes are not limited to one that is constructed by bending, e.g., single rod, and therefore may be exemplified by a structure in which two straight electrodes are jointed and fixed with a metal plate or the like.

Furthermore, a linear electrode can also be employed in this invention. In this case, the distance between the feeding portion and the grounded portion is preferred to be nearly N/2 times of an excitation wavelength of the high-frequency power.

Second Embodiment

Figure 2:
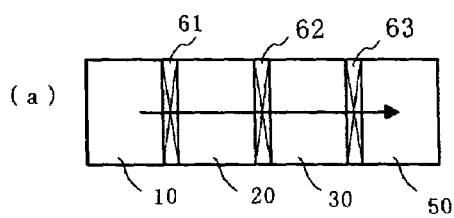
FIGS. 2a–2c is a schematic view showing the second embodiment of plasma CVD apparatus of this invention.
Figure 2:
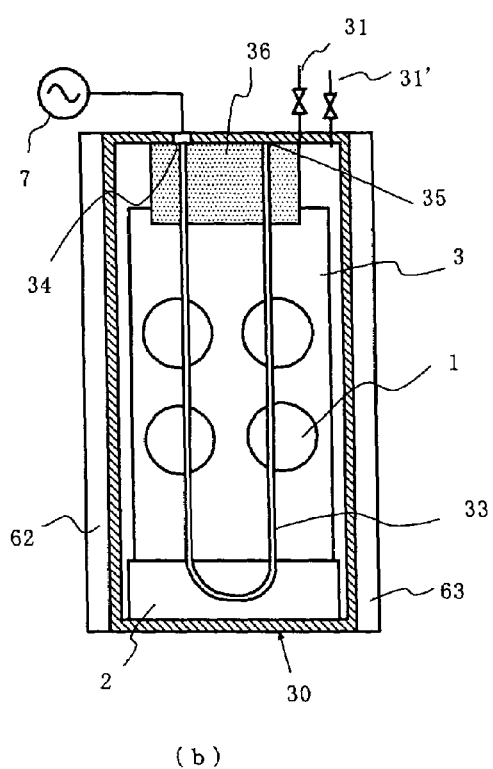
Figure 2:
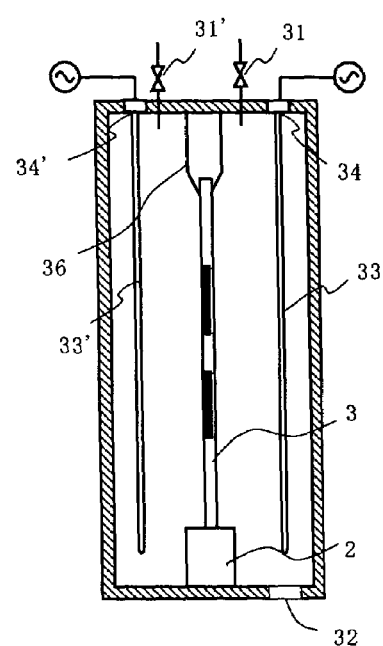

Although the p-type and n-type a-Si films are formed in the different PCVD chambers in the plasma CVD apparatus of FIG. 1, it is also possible to form different films on respective surfaces of substrate in one PCVD chamber. The embodiment for this purpose is shown in FIG. 2. As shown in FIG. 2(a), the whole apparatus is nearly the same as that shown in FIG. 1, except that the number of PCVD chamber is one.

As shown in FIGS. 2(b) and 2(c), two inductively coupled electrodes, whose power feeding portions 34, 34' are connected to high-frequency power sources, are arranged in plasma CVD chamber 30. The substrate holder is transported into the PCVD chamber and placed between these two electrodes. In addition, two gas supply pipe lines 31, 31' for two film forming gases ($SiH_4/PH_3$ gas and $SiH_4/B_2H_6$ gas) are connected to the PCVD chamber.

When the substrate holder is transported into PCVD chamber 30, $SiH_4/PH_3$ gas is introduced through gas supply pipe line 31 into the chamber and its pressure is set at a predetermined value. Then, high-frequency power is fed to electrode 33 to generate plasma along electrode 33. Thereby, the n-type a-Si film deposits on the substrate surface which faces electrode 33. When the thin film with a predetermined thickness is deposited, the supply of high-frequency power and the film forming gas are cut off and the chamber is evacuated.

Then, $SiH_4/B_2H_6$ gas is introduced through gas supply pipe line 31', high-frequency power is similarly fed to electrode 33' to generate plasma and form the p-type a-Si film with a predetermined thickness on the substrate surface which faced electrode 33'. Thus, the p-i-n junction is formed. Then, the substrate holder is transported to cooling chamber 50 and taken out of the chamber after cooled.

As has been mentioned, the formation of different films can be carried out in the single chamber.

Third Embodiment

Figure 3:
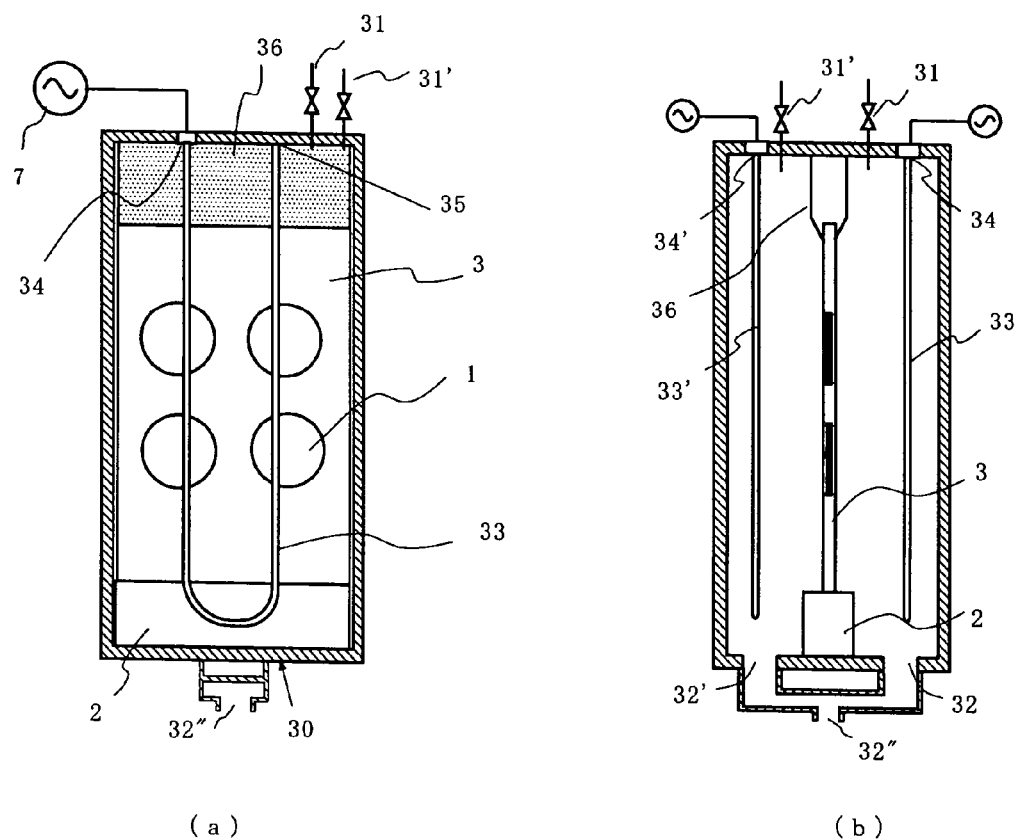
FIGS. 3a–3b is a schematic view showing the third embodiment of plasma CVD apparatus of this invention.

In the example of FIG. 2, the p-type a-Si film is formed after the n-type a-Si film is formed. It is also possible in this invention to simultaneously form two different films. The third embodiment which makes possible simultaneous formation of different films is shown in FIG. 3.

The apparatus has nearly the same configuration as that of FIG. 2(a), except for the PCVD chamber. The PCVD chamber of this embodiment, which is shown in FIG. 3, differs from that shown in FIGS. 2(b) and 2(c) in the following points. That is, in the case of FIG. 2, the blockage is provided to prevent plasma generated in one film forming space for the n-type a-Si film or p-type a-Si film from diffusing to the other film forming space and depositing on the p-type a-Si film or n-type a-Si film, respectively. However, in the third embodiment, the length of substrate holder fixing jig 36 should be made as close as possible to the length of chamber, so that it can act as the partition plate to prevent the mutual gas mixing between the film formation spaces for the n-type and the p-type a-Si film (cross contamination). In addition, the length of chamber is also made nearly the same as the length of substrate holder to narrow the clearance. The gas supply pipe line and exhaust port 32, 32' are provided, in each film formation space. In this case, the exhaust gas flowing through two exhaust ports 32 and 32' is gathered downstream (32"), Thus, one exhaust gas system is installed for this chamber.

When two different gases are introduced simultaneously, the respective gases may flow into other film forming spaces through the clearance between the substrate holder and partition plate, and the chamber walls. However, the carrier concentration in the p-type or the n-type film is mainly determined by the concentration difference between phosphor (P) element and boron (B) element in the film. Therefore, the contamination of B element in the n-type a-Si film or P element in the p-type a-Si film hardly influence the characteristics of solar cell so far as the amount of B element or P element is small, compared with the number density of P element or B element, respectively. Therefore, solar cells can be manufactured to have a desired characteristic.

Thus, the tact time of PCVD chamber can be further shortened by carrying out the simultaneous film formation in the same chamber.

In this embodiment, the exhaust port is provided in each film forming space. However, for example, the configuration having one exhaust port around the center of bottom plate of vacuum chamber is also available. Moreover, since the substrate holder fixing jig is also used as a partition plate, the partition plate is constructed to contact the substrate holder in the embodiment. However, in the case where the substrate holder fixing jig is unnecessary or the partition plate is separately arranged, the partition plate is not necessarily in contact with the substrate holder and the cross contamination may be prevented by controlling the gas flow even if there is a clearance.

Fourth Embodiment

The embodiments have referred to the manufacturing apparatus and the manufacturing method of the p-type and the n-type a-Si film directly on the silicon substrate. However, in order to reduce the defects in the p-i junction and the i-n junction and to further improve solar cell characteristics, it is preferable to form the i-type a-Si film on both surfaces of crystal silicon substrate before forming the p-type and the n-type a-Si film. The apparatus configuration for this purpose is shown in FIG. 4 as the fourth embodiment of this invention.

Figure 4:
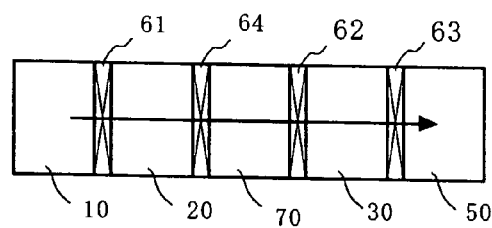
FIG. 4 is a schematic view showing the fourth embodiment of plasma CVD apparatus of this invention.

The plasma CVD apparatus of FIG. 4 is constructed by connecting a PCVD chamber 70 for i-type a-Si film deposition to PCVD chamber 30 of the plasma CVD apparatus shown in FIG. 2($a$). The PCVD chamber 70 has the same configuration as that shown in FIGS. 2($b$) and 2($c$), and has one gas supply pipe line of $SiH_4$ gas. High-frequency power is fed to two inductively coupled electrodes simultaneously after $SiH_4$ gas is introduced to deposit the i-type a-Si film on both surfaces of substrate.

The formation of the n-type and the p-type a-Si film is carried out in the same manner as in the second embodiment.

Fifth Embodiment

Next, a plasma CVD apparatus with a very high productivity is explained as the fifth embodiment of this invention. The plasma CVD chambers of FIGS. 1–4 are used for continuously forming thin film on both surfaces of substrates held by one substrate holder. In contrast, in order to further improve the productivity, the chamber is preferably constructed so as to process at a time a plurality of substrate holders holding as many substrates as possible. The plasma CVD chamber using inductively coupled electrodes of this invention can be easily modified for this purpose. The examples of apparatus configuration for mass production are shown in FIGS. 5 and 6.

Figure 5:
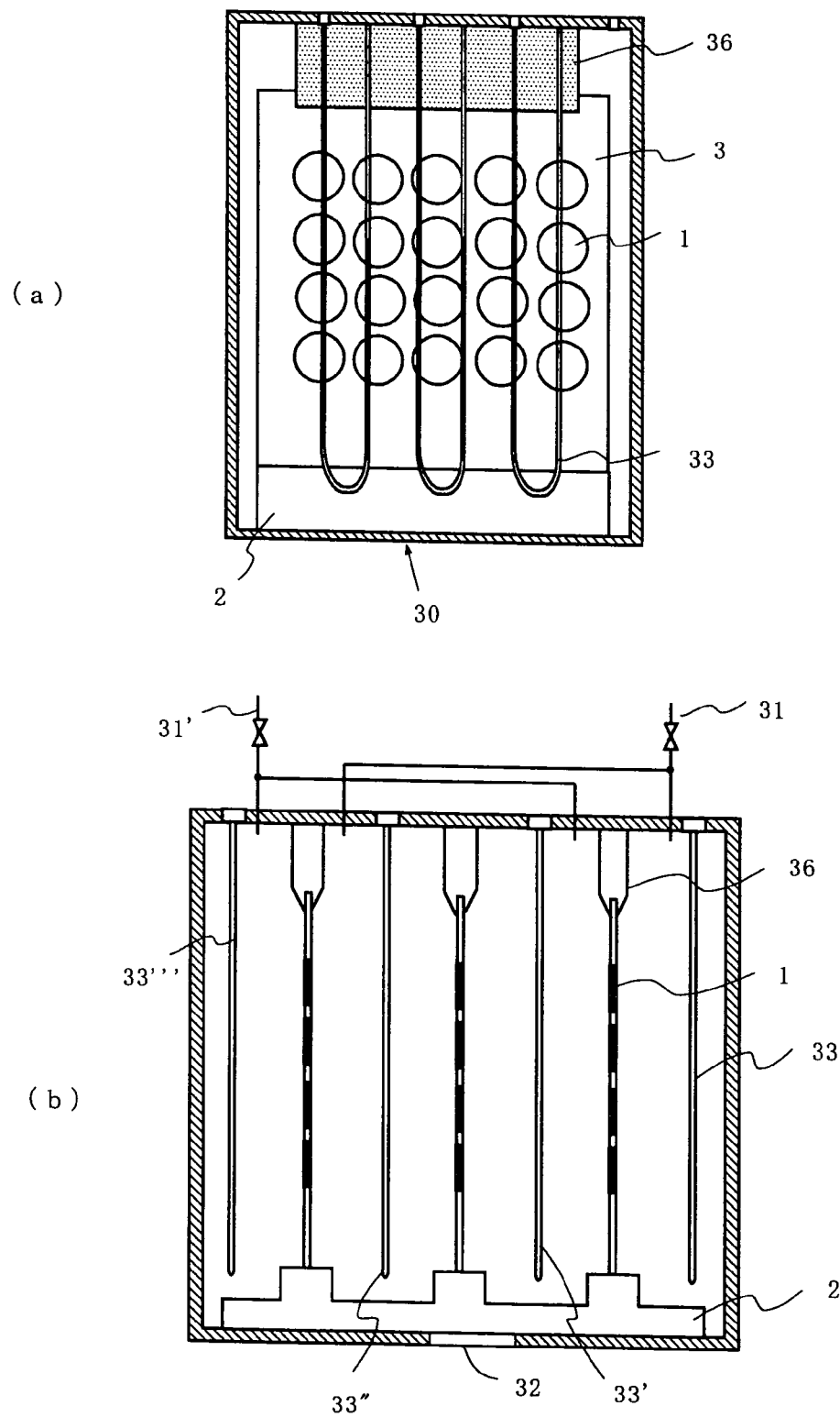
FIGS. 5a–5b is a schematic view of plasma CVD apparatus for mass production corresponding to apparatus of FIG. 2.
Figure 6:
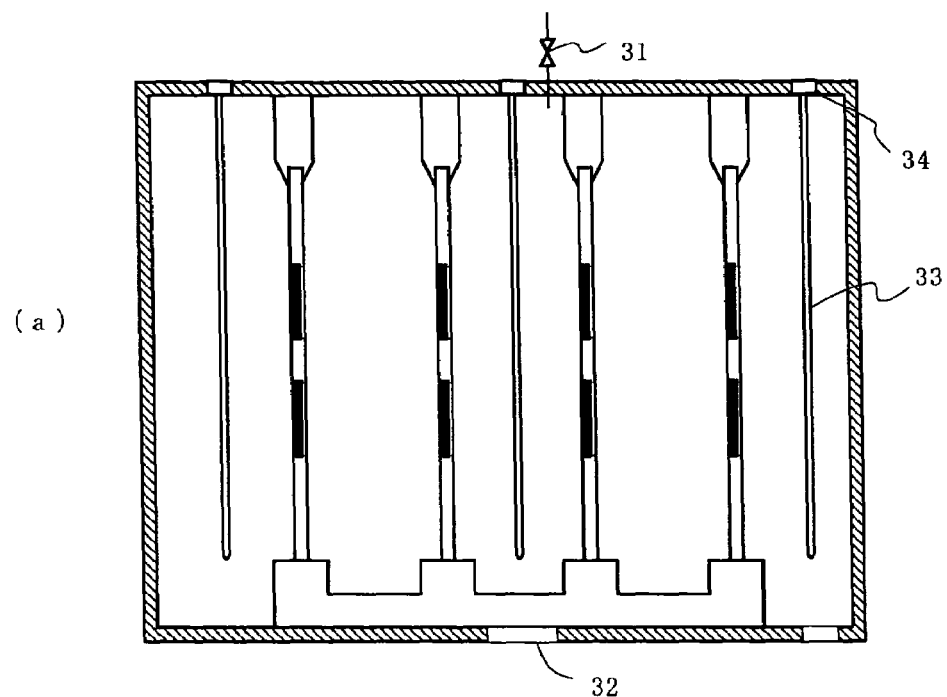
FIGS. 6a–6b is a schematic view of plasma CVD apparatus for mass production corresponding to apparatus of FIG. 1.
Figure 6:
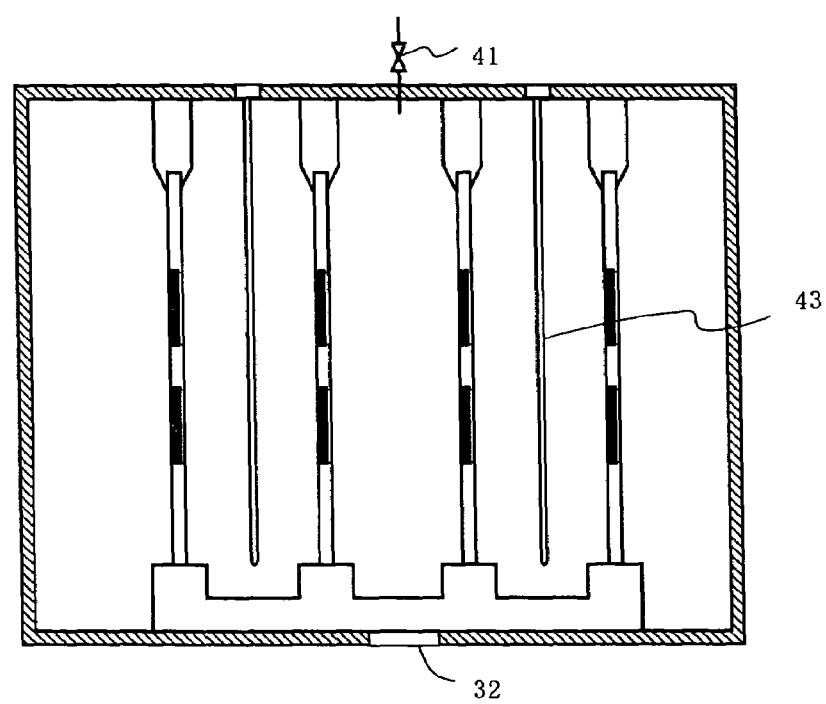

The apparatus of FIG. 5 is the mass production version of the apparatus shown in FIG. 2. FIGS. 5($a$) and 5($b$) are schematic views showing the inside of PCVD chamber seen from the front and seen toward the transportation direction, respectively. Since a number of inductively coupled electrodes are arranged in parallel to each other forming one plane facing substrate holder, as shown in FIG. 5($a$), the film formation can be made for larger-sized substrate holder (namely, substrate holder holding more substrates). In addition, the film formation can be made for many substrate holder in one vacuum chamber, as shown in FIG. 5($b$), only by alternatively arranging the substrate holder and the layer of electrode array.

The $SiH_4/PH_3$ gas is introduced through gas supply pipe line 31 and high-frequency power is fed to electrodes 33 and 33" to form the n-type a-Si film on the one surface of substrates, which faces these electrodes. Then, the gas is switched to $SiH_4/B_2H_6$ and high-frequency power is fed to electrodes 33' and 33'" to form the p-type a-Si film on the other surface of substrates which faces these electrodes. Here, since the distance between the electrode and the substrate can be made as small as about 30 mm, a number of substrate holders and electrodes can be arranged in small space.

The apparatus of FIG. 5 is constructed so as to form different films separately on respective surfaces of substrates. The similar configuration may be employed for the apparatus shown in FIG. 3 which is used for simultaneous film formation.

The apparatus of FIG. 6 is the mass production version of the apparatus shown in FIG. 1. FIGS. 6($a$) and 6($b$) is schematic views showing the inside of the first and the second PCVD chambers seen toward the transportation direction, respectively. In this case, two substrate holders are arranged between two inductively coupled electrode array layers.

Although the present invention has been explained about the method and apparatus for forming the a-Si film on both surfaces of crystal silicon substrate so far, the invention is not restricted to these embodiments and can be applied to a variety of applications other than solar cells, such as surface modification of glass and plastic substrate.

APPLICATION TO INDUSTRY

The present invention enable us to form thin films of excellent uniform thickness without placing the backing plate behind the substrate, and consequently to omit the step of turning substrates over and reduce the number of heating/cooling processing steps, which remarkably improve the productivity of the film formation on both surfaces of substrate.

Furthermore, the configuration in which substrate holders and inductively coupled electrode arrays are alternatively arranged can be adopted to provide the plasma CVD apparatus for mass production, which makes it possible to simultaneously process a number of substrates.

The invention claimed is:

1. A plasma CVD apparatus, comprising:
a first vacuum chamber and a second vacuum chamber connected through a gate valve, each vacuum chamber equipped with a gas supply port and an exhausting port,
a plurality of electrode array layers, each array layer having a plurality of inductively coupled electrodes forming one plane and each electrode having a power feeding portion and a grounded portion, the plurality of electrode array layers being arranged in parallel to each other, and being arranged in N layers (where N is a natural number of 2 or larger) in said first vacuum chamber and in (N−1) layers in said second vacuum chamber, and at least a pair of substrate holders, each substrate holder holding at least one substrate at a circumference portion so that both surfaces of the substrate are exposed, whereby said pair of substrate holders are transported between adjacent electrode array layers in said first vacuum chamber, a first film forming gas is introduced through the gas supply port and high frequency power is fed to the power feeding portions to generate plasma and to form a first thin film on one surface of substrates facing said adjacent electrode array layers, and said pair of substrate holders are then transported into the second vacuum chamber so that the other surface of the substrates on which said first thin film is not formed faces to an electrode array layer, and a second film forming gas is introduced through the gas supply port and high-frequency power is fed to the power feeding portions of inductively coupled electrodes to generate plasma and to form a second thin film on said other surface on which the first thin film is not formed.

2. A plasma CVD apparatus, comprising:

a first vacuum chamber and a second vacuum chamber connected through a gate valve, each vacuum chamber equipped with a gas supply port and an exhausting port, a plurality of electrode array layers, each array layer having a plurality of inductively coupled electrodes forming one plane and each electrode having a power feeding portion and a grounded portion, the plurality of electrode array layers being arranged in parallel to each other, and being arranged in N layers (where N is a natural number of 2 or larger) in said first vacuum chamber and in (N−1) layers in said second vacuum chamber, and at least a pair of substrate holders, each substrate holder holding at least one substrate at a circumference portion so that both surfaces of the substrate are exposed, a carrier for carrying said pair of substrate holders into the first and second vacuum chambers, each of the first and second vacuum chambers including a gas supply port for introducing a gas and a power feeding portion for feeding a high-frequency power to the electrodes in each vacuum chamber, wherein the electrodes are arranged in the first and second vacuum chambers so that in the first vacuum chamber a first side of each substrate is exposed to one of the electrodes and a second side of each substrate is not exposed to any of the electrodes and in the second vacuum chamber the second side of each substrate is exposed to one of the electrodes and the first side of each substrate is not exposed to any electrodes.

3. The apparatus of claim 2, wherein the first chamber includes at least two electrodes and the electrodes in the first chamber are positioned so that the pair of substrate holders fits between the at least two electrodes and the second chamber includes at least one electrode and the one electrode is positioned so that the one electrode fits between the pair of substrate holders.

* * * * *